(12) United States Patent
Baur et al.

(10) Patent No.: US 7,592,636 B2
(45) Date of Patent: Sep. 22, 2009

(54) RADIATION-EMITTING SEMICONDUCTOR COMPONENT AND METHOD FOR THE PRODUCTION THEREOF

(75) Inventors: Johannes Baur, Laaber (DE); Dominik Eisert, Regensburg (DE); Michael Fehrer, Bad Abbach (DE); Berthold Hahn, Hemau (DE); Volker Harle, Laaber (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 551 days.

(21) Appl. No.: 10/529,625

(22) PCT Filed: Sep. 23, 2003

(86) PCT No.: PCT/DE03/03157

§ 371 (c)(1),
(2), (4) Date: Nov. 18, 2005

(87) PCT Pub. No.: WO2004/032248

PCT Pub. Date: Apr. 15, 2004

(65) Prior Publication Data

US 2006/0124945 A1    Jun. 15, 2006

(30) Foreign Application Priority Data

Sep. 30, 2002 (DE) ................. 102 45 634
Nov. 19, 2002 (DE) ................. 102 53 911

(51) Int. Cl.
*H01L 21/00* (2006.01)
*H01L 23/495* (2006.01)

(52) U.S. Cl. ............... 257/98; 257/676; 257/E25.032; 257/E21.001; 438/25; 438/27; 438/113; 438/462

(58) Field of Classification Search .......... 257/79, 257/98, 676, E25.032; 438/22, 25, 26, 27, 438/29
See application file for complete search history.

(56) References Cited

U.S. PATENT DOCUMENTS 5,087,949 A    2/1992  Haitz (Continued)

FOREIGN PATENT DOCUMENTS

DE    24 16 098 A    10/1975

(Continued)

OTHER PUBLICATIONS

English translation of the Communication issued May 27, 2009 in the corresponding Japanese Application and comments from applicants' representative.

*Primary Examiner*—Evan Pert
*Assistant Examiner*—Scott R Wilson
(74) *Attorney, Agent, or Firm*—Cohen, Pontani, Lieberman & Pavane LLP

(57) ABSTRACT

A radiation-emitting semiconductor component having a radiation-transmissive substrate (1), on the underside of which a radiation-generating layer (2) is arranged, in which the substrate (1) has inclined side areas (3), in which the refractive index of the substrate (1) is greater than the refractive index of the radiation-generating layer, in which the difference in refractive index results in an unilluminated substrate region (4), into which no photons are coupled directly from the radiation-generating layer, and in which the substrate (1) has essentially perpendicular side areas (5) in the unilluminated region. The component has the advantage that it can be produced with a better area yield from a wafer.

27 Claims, 5 Drawing Sheets

U.S. PATENT DOCUMENTS

| | | |
|---|---|---|
| 5,187,547 A | 2/1993 | Niina et al. |
| 5,744,828 A * | 4/1998 | Nozaki et al. ................ 257/94 |
| 6,121,636 A | 9/2000 | Kawai et al. |
| 2003/0015721 A1* | 1/2003 | Slater et al. ................ 257/99 |
| 2004/0119085 A1 | 6/2004 | Bader et al. |
| 2006/0174825 A1* | 8/2006 | Basceri et al. ................ 117/89 |

FOREIGN PATENT DOCUMENTS

| | | |
|---|---|---|
| DE | 25 54 029 A | 6/1976 |
| DE | 41 30 878 A | 3/1993 |
| DE | 101 39 798 A | 3/2003 |
| DE | 102 08 170 A | 9/2003 |
| DE | 102 44 986 A1 | 4/2004 |
| EP | 0 905 797 A | 3/1999 |
| EP | 1 345 276 A | 9/2003 |
| JP | 62025472 A | 2/1987 |
| JP | 05-335622 | 12/1993 |
| JP | 08-102549 | 4/1996 |
| JP | 08-288543 | 11/1996 |
| WO | WO 01/61764 A | 8/2001 |
| WO | WO 01/61765 A1 | 8/2001 |
| WO | WO 01/73859 A | 10/2001 |
| WO | WO 01/80322 A | 10/2001 |
| WO | WO 02/061847 A2 | 8/2002 |
| WO | WO 03/010817 A | 2/2003 |
| WO | WO 03/030271 A | 4/2003 |

* cited by examiner

RADIATION-EMITTING SEMICONDUCTOR COMPONENT AND METHOD FOR THE PRODUCTION THEREOF

RELATED APPLICATIONS

This is a U.S. national stage of application No. PCT/DE2003/003157, filed on 23 Sep. 2003.

This patent application claims the priority of German patent application nos 102 45 634.8 and 102 53 911.1, filed 30 Sep. 2002 and 19 Nov. 2002, respectively the disclosure content of which is hereby incorporated by reference.

FIELD OF THE INVENTION

The invention relates to a radiation-emitting semiconductor component having a radiation-transmissive substrate, on the underside of which a radiation-generating layer is arranged. The substrate has inclined side areas. Furthermore, the invention relates to a method for producing the radiation-emitting semiconductor component.

BACKGROUND OF THE INVENTION

The document U.S. Pat. No. 5,087,949 discloses a component of the type mentioned in the introduction, in which the radiation-generating layer on the underside of the substrate has only a very small lateral extent, so that the radiation source is regarded as a point light source for the optimization of the form of the substrate. Accordingly, the substrate is shaped in such a way that the light falling onto the interfaces of the substrate from the light source from the inside is as far as possible always incident at an angle that is less than the critical angle for total reflection. What is thereby achieved is that a greatest possible part of the light generated by the radiation-generating layer is transmitted through the substrate. The optimization of the shaping of the substrate with regard to an essentially point-type light source on the underside thereof has the effect that such a substrate is only poorly suited to radiation-generating layers having a large-area extent.

The document U.S. Pat. No. 5,187,547 discloses a component of the type mentioned in the introduction, in which a radiation-generating layer applied in large-area fashion is arranged on the underside of a radiation-transmissive substrate, as a result of which the quantity of light generated overall is significantly increased compared with a point-type light source. In this case, the form of the substrate is chosen in such a way that a continuous oblique edge runs between the top side and the underside, from which edge the light is coupled out from the interior of the substrate toward the outside. The substrate side edge that is continuously bevelled from top to bottom has the disadvantage that the production of a multiplicity of such substrates from a wafer, comprising a material suitable therefor, leads to a reduced area yield of the wafer.

This is because the V-shaped incisions situated between two substrates are usually sawn using a suitable saw which, during the sawing of the substrate, leads to a not inconsiderable lateral removal of material, whereby the useable area of the individual substrates disadvantageously decreases. What is more, sawing completely through a substrate using a V-shaped saw blade is a disadvantage since the saw blade can easily be damaged in this case.

SUMMARY OF THE INVENTION

One object of the present invention is to provide a radiation-emitting semiconductor component which can be produced with a high area yield from wafers and which is suitable for high light powers.

Another object of the invention is to provide a method for producing such a component.

This and other objects are attained in accordance with one aspect of the present invention directed to a radiation emitting semiconductor component comprising a radiation-transmissive substrate with inclined side areas and having a refractive index (n1). The radiation generating layer is arranged on an underside of the substrate and has a refractive index (n2), wherein the refractive index of the substrate (n1) is greater than the refractive index (n2) of the radiation generating layer. The difference between the refractive indexes results in an unilluminated substrate region into which no photons are coupled directly from the radiation generating layer. The substrate has essentially perpendicular side areas in the unilluminated region.

The difference in refractive indexes results in an unilluminated region in the substrate, into which no photons are coupled directly from the radiation-generating layer. This blind angle which arises in this way results from the fact that, on account of the laws of refraction, the light cannot be coupled into the substrate at arbitrary angles, rather there is a minimum limiting angle for this, which is determined by the difference in refractive index.

In the case of the invention, that side of the radiation-generating layer which is remote from the substrate preferably serves for the mounting of the component (upside down mounting). For this purpose, a corresponding mounting area is expediently provided on that side of the radiation-generating layer which is remote from the substrate.

In the unilluminated region, the substrate has essentially perpendicular side areas. The latter are to be understood to be such side areas which, with the available means, can be embodied as far as possible perpendicular to the underside of the substrate. In this case, by way of example, the means shall be sawing of the substrate by means of a straight saw blade or else breaking of the substrate from a larger substrate for the purpose of singulation.

Such a component has the advantage that it can be produced with a significantly smaller area requirement on account of the perpendicular side areas situated in a side region of the substrate. On account of the perpendicular side areas, which can form a base for example on the underside of the substrate, the section of the substrate can be limited to a partial region of the substrate thickness, which reduces the lateral removal of substrate material to the required minimum. This is because the oblique side areas are required for optimally coupling out the light from the interior of the substrate. However, since no light has to be coupled out from the substrate in the region of the blind angle, it is possible, without adversely influencing the coupling-out of light, to optimize the outer form of the substrate at this location with regard to improved producibility. Such simplified or improved producibility, which may mean in particular an improved area yield during the production of a plurality of individual substrates from a large substrate by singulation, can be ensured by virtue of the fact that, in the region of the perpendicular edges, the substrate can be singulated for example by breaking or else by straight sawing.

Straight sawing involves a very much smaller lateral removal of material than sawing of the oblique edges. If the singulation is performed by breaking the substrate at the location of the straight side edges, then the lateral removal of material and thus the area yield on the large substrate are optimized further.

Accordingly, a method for producing the component is specified, V-shaped trenches being sawn into a substrate by means of a suitably shaped saw. In this case, however, care is taken to ensure that a residual thickness of the substrate remains throughout. In a subsequent step, the substrate is singulated to form smaller individual substrates, to be precise along the V-shaped trenches.

This method has the advantage that, by reducing the depth of the V-shaped trenches in comparison with the substrate forms known from the prior art, it is possible to significantly reduce the lateral removal of material and also the wear in the case of the saws that are suitable for sawing V-shaped trenches.

The singulation of the substrates may be effected by means of a straight saw blade, by way of example, which has significantly fewer rejects than a V-shaped saw blade.

Moreover, the singulation of the substrates may also be effected by breaking, whereby the rejects are reduced still further.

In one embodiment of the component, the perpendicular side areas form a base on the underside of the substrate, the inclined side areas adjoining the top side of said base. Such a shaping of the substrate has the advantage that, by virtue of the base at the underside of the substrate, the entire unilluminated region of the substrate can be utilized for the perpendicular side areas. Furthermore, such a shaping has the advantage that the V-shaped depressions can be sawn between two individual substrates from one side and afterward only a single step is necessary for processing the side area of the substrate. In another embodiment of the component, the upper boundary of the unilluminated region coincides with the upper boundary of the base. This results in the advantage that the entire height of the unilluminated region can be used for forming the base. The higher the base of the substrate is made, the lesser the depth to which the V-shaped incision has to be made between two individual substrates and the more advantageously the area yield on a large substrate can be configured.

The base can also be elevated still further beyond the unilluminated region of the substrate, which affords further advantages with regard to the production method. However, this is then done at the expense of the coupling-out of the light from the substrate, for which the inclined side areas are more advantageous.

In accordance with another embodiment of the component, the radiaton-generating layer covers the underside of the substrate apart from an outer free edge having a finite width. The fact that the radiation-generating layer almost completely covers the underside ensures that a correspondingly large amount of current can be coupled into the radiation-generating layer on account of the enlarged area, which increases the luminous efficiency of the radiation-generating layer.

What can be achieved by virtue of the radiation-generating layer not quite reaching as far as the edge of the underside of the substrate is that the radiation-generating layer, which reacts very sensitively to mechanical damage since it is covered only with a thin silicon nitride layer, by way of example, can be protected against damage during the singulation of individual substrates from a large wafer.

Furthermore, the formation of a free edge at the underside of the substrate has the advantage that the geometrical extent of the unilluminated substrate region can be determined by the choice of a suitable width for said free edge. The smaller the extent of the radiation-generating layer on the underside of the substrate, the larger is the unilluminated substrate region because the latter is determined by the limiting angle, which in turn depends on the difference in refractive index, and also by the region from the edge of the radiation-generating layer up to the edge of the substrate over which the angle brings about an expansion of the unilluminated substrate region in the direction of the substrate edge.

In another embodiment of the component, the radiation-generating layer has bevelled edges configured in such a way that light which is generated in the radiation-generating layer and is emitted laterally with respect to the substrate is reflected in the direction of the substrate.

A separate invention can be seen in the fashioning of the radiation-generating layer and can advantageously be employed independently of the specific fashioning of the substrate and also independently of the difference in refractive index between the substrate and the radiation-generating layer since the bevelled side edges of the radiation-generating layer result in an advantageous deflection of the generated radiation in the direction of the substrate. The luminous efficiency of the radiation-generating component can advantageously be increased as a result.

Accordingly, the embodiment of the invention with regard to the shaping of the radiation-generating layer merely necessitates a substrate to whose underside a radiation-generating layer is applied.

In order to provide for the reflection of the radiation in the correct direction, it is advantageous if the bevelled side edges of the radiation-generating layer form an angle of between 20 and 70° with the underside of the substrate. Preferably, it is advantageous to choose an angle of between 30 and 60°. In the aforementioned angular range, it is additionally possible to specify a suitable angle for total reflection. In this case, this angle depends on the material by which the radiation-generating layer is surrounded. Depending on the difference in refractive index between the radiation-generating layer and the surroundings thereof, it is possible to choose a suitable angle for a total reflection of the light generated in the radiation-generating layer at the bevelled side edge.

Moreover, it is also possible to effect the total reflection by means of an optically reflective material on the bevelled side edge. By way of example, the bevelled side edge may be covered with a layer containing aluminum or silver. This requires a passivation layer between the semiconductor and the metal.

In another embodiment of the component, in which case the aforementioned embodiments may be valid in a particularly advantageous manner each one by itself or else in combination with one another, contact elements are arranged on the top side of the substrate. Furthermore, the substrate material is chosen in such a way that the transverse conductivity, that is to say the conductivity laterally with respect to the underside of the substrate, leads to a conical extension of a current coupled into the substrate from the contact element. A conical extension is obtained in particular on account of the anisotropic conductivity of the substrate. A suitable material for the substrate is silicon carbide, by way of example.

Furthermore, the contact elements are spaced apart from one another in such a way that the current expansion cones touch one another at a depth at which the entire cross-sectional area of the substrate is energized. Accordingly, the contact elements are to be arranged in such a way that, on the one hand, the substrate is energized as far as possible over the entire area even at a relatively small depth of the cross-sectional area to be energized below the substrate surface. On the other hand, that depth at which complete energization of the cross-sectional area of the substrate is present should have the same magnitude as that depth in the substrate at which the current expansion cones touch one another.

For the case where the current expansion cones of the individual contact webs already overlap at a depth where the entire cross-sectional area of the substrate is not yet energized, this would result in the disadvantage that, with a complete energization of the substrate at a relatively large depth, a high forward voltage would result, which would be disadvantageous for the electrical properties of the component. Although a large-area energization of the substrate at a relatively low depth below the substrate surface could be effected in this case as well, the number of contact webs on the surface of the substrate would then have to be increased, which would have a disadvantageous influence on the luminous efficiency from the surface of the substrate since the contact webs are usually not completely transparent or reflective.

An independent invention can be seen in the arrangement of the contact elements on the surface of the substrate and can be applied to components of the type mentioned in the introduction independently of the base formation on the underside of the substrate or independently of edge bevelling of the radiation-generating layer.

In one embodiment of the component, the contact elements are embodied in the form of interconnects running along nested squares. The squares have edges lying equidistantly with respect to one another and parallel to one another. This form of the contact elements has the advantage that a uniform energization of the entire substrate surface can take place. What is more, the aforementioned structure is easy to realize in terms of phototechnology.

In a development of this embodiment of the component, the interconnects may have widths that differ from one another in accordance with the surface of the substrate that is to be energized. In particular, it is advantageous if the interconnects of the inner squares are narrower than the interconnects of the squares situated further outward. Since the interconnects of the squares situated further outward also have to energize the substrate area lying below the side bevelling, a relatively large substrate area also has to be energized by these interconnects. In order to ensure a sufficient contact area between the interconnects and the substrate here, it is advantageous for the outer interconnects to be made wider than the inner interconnects. Widening the inner interconnects beyond the extent required owing to the electrical properties is not advantageous since the optical properties of the component would have to suffer in this case.

In one embodiment of the component, the substrate contains silicon carbide. Silicon carbide as substrate material has the advantage that it has a good electrical conductivity. It furthermore has the advantage that it enables the deposition of gallium nitride as material for semiconductor lasers or light-emitting diodes for blue light.

Furthermore, it is advantageous if the substrate comprises the hexagonal 6H silicon carbide poly type. Hexagonal 6H silicon carbide has the property that the electrical conductivity perpendicular to the crystallographic c axis, which is the axis that is perpendicular to the surface of the substrate, is approximately three times as high as parallel to said axis. This results, in particular, in the advantage that current expansion cones arise which enable a uniform energization of the substrate.

A uniform energization of the substrate is advantageous, in particular, if high currents are intended to be applied to the radiation-generating layer, with the aim of generating the highest possible quantity of light.

It is advantageous, moreover, in particular in combination with a substrate made of silicon carbide, if the radiation-generating layer contains gallium nitride. In this case, the material is not restricted to gallium nitride, but rather may also include modifications of gallium nitride, in particular semiconductor materials based on gallium nitride. Particular consideration is given here to gallium nitride, gallium aluminum nitride, indium gallium nitride and also p- or n-doped variants of the aforementioned materials. Gallium nitride and also the aforementioned modifications thereof have the advantage that they permit the realization of radiation-generating layers which emit in the particularly attractive wavelength range of blue light.

The present invention relates in particular to semiconductor components in which the underside of the substrate has a width B of at least 300 μm.

These large-area substrates have the advantage that a relatively large amount of current can be used for energizing the radiation-generating layer since sufficient area and, consequently, a sufficiently low nonreactive resistance can be obtained.

As a result, it is possible to optimize the series resistance and thus the operating voltage and the efficiency of the component.

BRIEF DESCRIPTION OF THE DRAWINGS

The invention is explained in more detail below with reference to exemplary embodiments and the associated figures. In the figures, identical reference symbols designate elements that are alike or the functioning of which is alike.

DETAILED DESCRIPTION OF THE DRAWINGS

Figure 1:
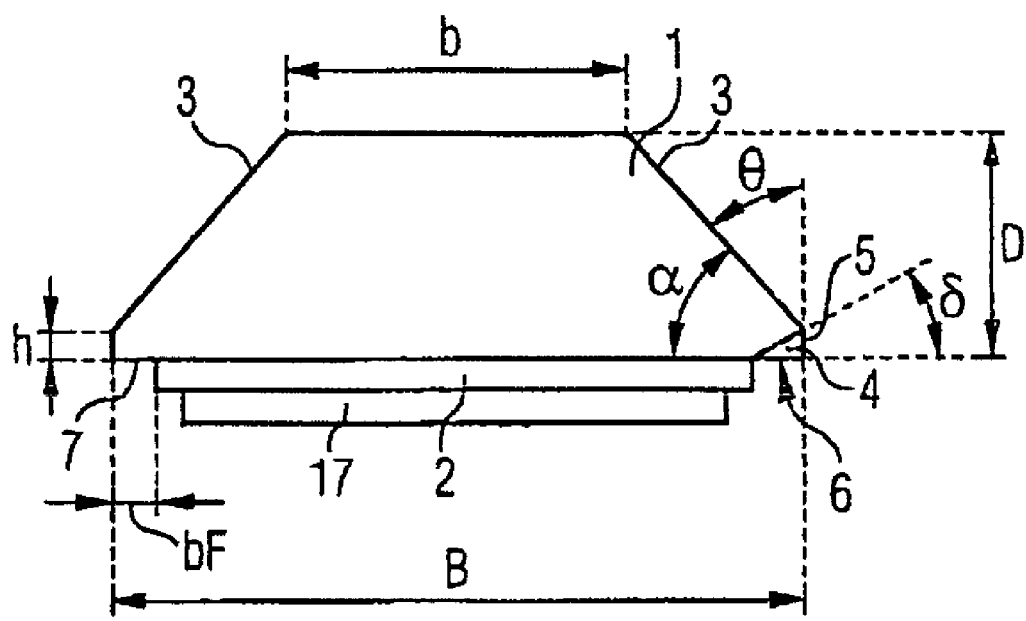
FIG. 1 shows by way of example a component in a schematic cross section.

FIG. 1 shows a substrate 1, which is covered by a radiation-generating layer 2 on the underside. The substrate 1 has a width B on the underside. Furthermore, the substrate 1 has a reduced width b on the top side. Furthermore, the substrate 1 has inclined side areas 3. It is particularly advantageous if the width B of the underside of the substrate has a value of between 300 and 2000 μm. A substrate width B of 1000 μm will be taken as a basis for the further considerations. The inclined side areas 3 form an angle α with the underside of the substrate. Depicted in complementary fashion with respect to said angle α is the angle θ, which the inclined substrate areas form with the normal to the substrate (said normal being depicted in dashed fashion) and which is plotted in FIG. 2, where the coupling-out efficiency is discussed. A contact layer 17 is applied on the underside of the radiation-generating layer 2, which contact layer may be a p-type mirror contact in the case of gallium nitride as basic material for the radiation-generating layer 2. Additional materials that are required along with the basic material to create a radiation-generating layer are well known by anyone with ordinary skill in the art. This means that the underside of the radiation-generating layer 2 is assigned to the positive electrical contact. The p-type mirror contact fulfils two functions in this case. Firstly, it provides for a large-area, low-resistance contact connection of the radiation-generating layer 2. Secondly, said contact layer 17 also has reflective properties, that is to say that the light generated in the radiation-generating layer 2 is reflected by the contact layer 17 and, consequently, can be coupled out from the component through the substrate 1.

As can be gathered from FIG. 1, the radiation-generating layer 2 is not applied over the whole area on the underside of the substrate 1. Rather, a free edge 7 is present. The free edge 7 is not covered by the radiation-generating layer 2. It will be assumed below that the material of the substrate 1 is hexagonal silicon carbide. However, other suitable materials for GaN-based layers as well as for other radiation-generating layers are well known to anyone of ordinary skill in the art. It will furthermore be assumed that the material of the radiation-generating layer 2 is gallium nitride or a semiconductor material which is based on gallium nitride and is suitable for the production of light-emitting diodes which emit in the blue spectral range or in semiconductor lasers.

It holds true for the refractive indexes of these materials that the refractive index of silicon carbide is n1=2.7 and, in comparison therewith, the refractive index of gallium nitride is n2=2.5. Accordingly, the refractive index of the substrate 1 is greater than the refractive index of the radiation-generating layer 2. This difference in refractive index has the effect that there are regions in the substrate 1 which are not illuminated by light from the radiation-generating layer 2. These unilluminated substrate regions 4 result from the laws of geometrical optics, which determine the angle at which radiation can pass from one material into the other material given a different refractive index. A so-called "blind angle" having the dimension δ results in the present case. In the case of the materials mentioned by way of example here, the blind angle δ is approximately 22.2°.

Proceeding from the outermost edge of the radiation-generating layer 2, a wedge-shaped, unilluminated substrate region 4 is thus produced, which is delimited by the underside of the substrate and also in cross section by the angle δ. It is clearly evident that the extent of the unilluminated substrate region 4 depends on the size of the free edge 7 at the edge of the radiation-generating layer 2. Moreover, the extent of the unilluminated substrate region 4 also depends on the difference in refractive index between the substrate 1 and the radiation-generating layer 2. At the underside of the substrate 1, in the region of the unilluminated substrate region 4, the substrate has a base 6, in the region of which the side areas 5 of the substrate 1 are essentially perpendicular to the underside of the substrate 1.

In the region of the base 6, the substrate 1 has essentially perpendicular side areas 5, which simplify the production of the substrate 1 and improve the yield of substrate area. In the example shown in FIG. 1, the base 6 has a height h of approximately 20 μm. The width of the free edge bF is approximately 25 μm. This is a suitable dimension on the one hand for protecting the radiation-generating layer 2 during the singulation of the substrate 1 from a wafer. On the other hand this dimension is small enough to ensure that the underside of the substrate 1 is covered over the largest possible area with the radiation-generating layer 2 and thus to ensure favorable electrical properties of the component. Moreover, attention shall also be drawn to the thickness D of the substrate, which is 250 μm.

The arrangement shown in FIG. 1 is particularly suitable for a good coupling-out of light from the radiation-generating layer 2 since photons that are emitted downward by the radiation-generating layer 2 can be reflected by the contact layer 17 and be coupled out via the substrate 1. Moreover, those photons which are emitted upward by the radiation-generating layer 2 are coupled out directly into the substrate 1 and from there toward the outside.

Figure 2:
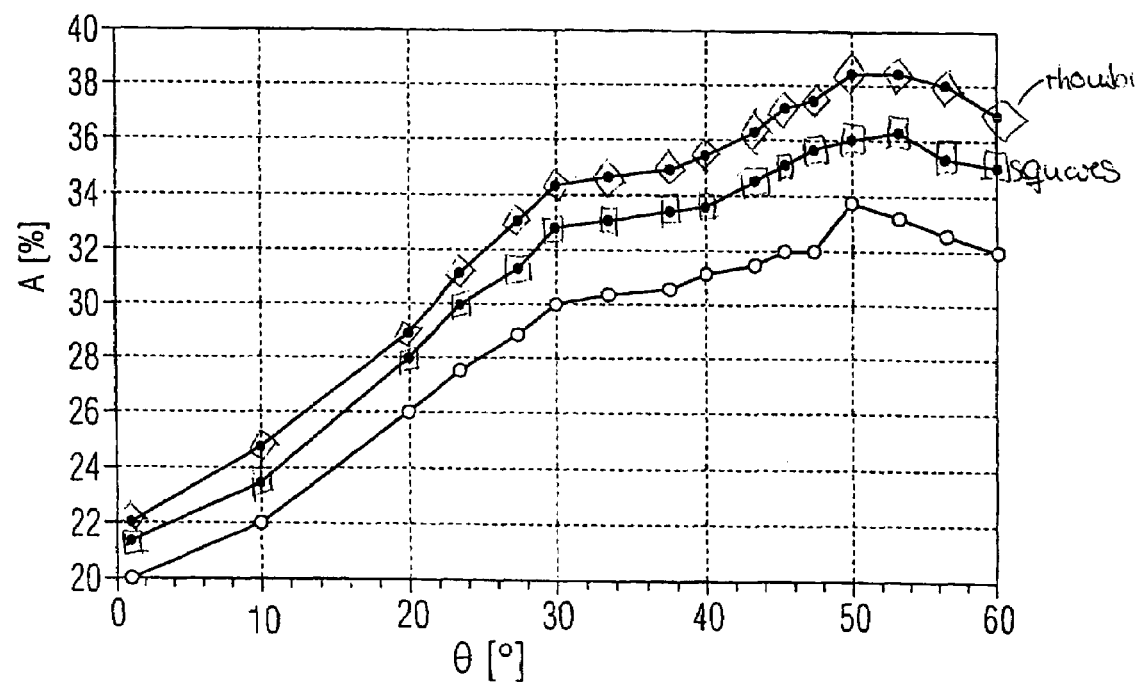
FIG. 2 shows by way of example a computer simulation relating to the coupling-out efficiency of components in accordance with FIG. 1.

FIG. 2 shows the results of a "ray tracer" simulation, the coupling-out efficiency A, measured in the unit %, being plotted against the angle θ, measured in °. In this case, there are three different measurement curves, the first measurement curve being represented by rhombi, the second measurement curve being represented by squares and the third measurement curve by circles. The first measurement curve with the rhombi is associated with a width B of 900 μm. The second curve with the squares is associated with a width B of 1000 μm. The third curve with the circles is associated with a width B of 1200 μm. In accordance with FIG. 2, an optimum coupling-out of light is achieved for an angle θ of 50°. However, in the choice of such an angle, depending on the size of the substrate 1, the remaining surface b may become very small, which would lead to an unfavorable series resistance. From an increased series resistance, additional power losses would over compensate for the gain in efficiency on account of the coupling-out. Accordingly, the present description of a semiconductor component shall specify an angle θ lying in the range of between 30° and 45° given a width B of 1000 μm and a substrate thickness of 250 μm. By taking account of the fact that the following holds true:

$$\alpha+\theta=90°$$

the two angles α and θ that are used alongside one another here can be converted to one another at any time.

A further advantage of the "upside down" mounting shown in FIG. 1, that is to say the mounting of the radiation-generating layer upside down, resides in the forward directed emission characteristic in comparison with the "upside up" mounting used as standard, which emission characteristic permits a more favorable coupling-out of light from a housing surrounding the substrate 1.

Figure 6:
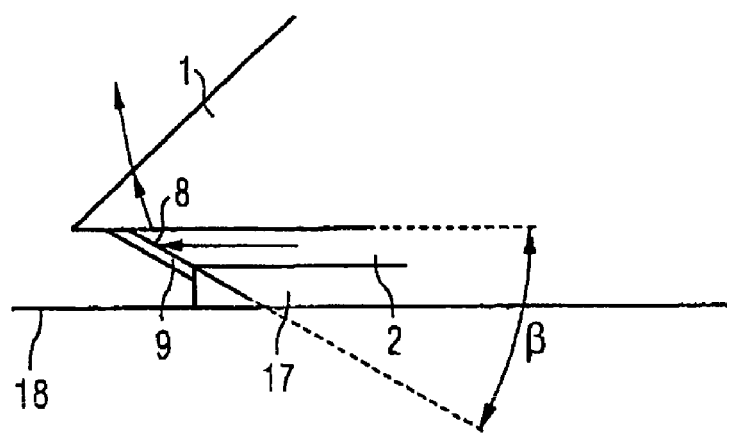
FIG. 6 shows a detail from FIG. 1, showing a bevelled side edge of the radiation-generating layer.

In this respect, reference is also made to FIG. 6, which reveals that the substrate 1 can be mounted with the underside or with the contact layer 17 on a leadframe 18, and which also reveals that essentially the top side of the substrate 1 is used for coupling-out light.

Figure 3:
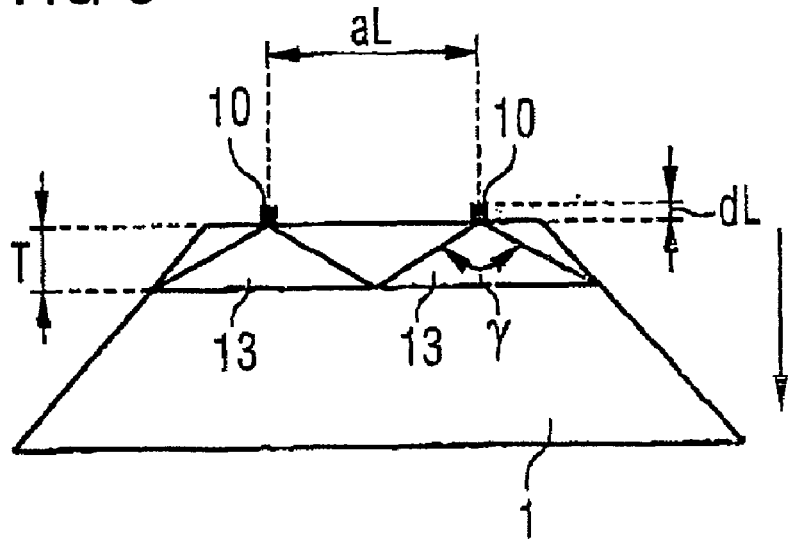
FIG. 3 shows the arrangement of contact elements in a schematic cross section.

FIG. 3 shows the principle for the arrangement of interconnects 10, which can contribute to a significant reduction of the series resistance of the component and to a high light transmission through the substrate surface. A suitable contact connection consists for example in arranging interconnects 10 on the top side of the substrate 1. On account of the conductivity that is present perpendicular to the crystallographic c axis (indicated by the perpendicular arrow downward) and is better than parallel thereto, a non-isotropic conductivity of the substrate 1 results. This results in an expansion of the electric current that is coupled into the substrate 1 through the interconnect 10, thereby resulting in so-called current expansion cones 13, which are illustrated in FIG. 3 and which demonstrate how the expansion of the current takes place on account of the lateral conductivity of said substrate 1. The example considered here of a substrate 1 made of hexagonal silicon carbide results in aperture angles γ of the current expansion cone 13 of 140°. The distance aL between the interconnects 10 is then ideally chosen in such a way that the following conditions occur simultaneously at a depth T of the substrate 1:

1. The entire cross-sectional area of the substrate 1 is energized, that is to say that every area section of the cross-sectional area at the depth T of the substrate 1 lies at least in one current expansion cone 13.

2. Adjacent current expansion cones 13 overlap one another for the first time at the depth T.

The conditions mentioned here produce an optimum for the positioning of the interconnects 10 since, on the one hand, an optimum energization of the substrate 1 and, on the other hand, a minimum coverage of the area of the substrate 1 and, consequently, good optical properties of the component result. In the example shown in FIG. 1, the distance between the two interconnects aL may be 50 μm. The thickness dL of the interconnects 10 may typically be 1 to 1.5 μm, dimensions being specified here which usually occur as standard in the patterning method used here. The interconnects 10 may also have any other suitable thickness dimension. The interconnects 10 may comprise any suitable electrically conductive material, for example aluminum or silver.

Figure 4:
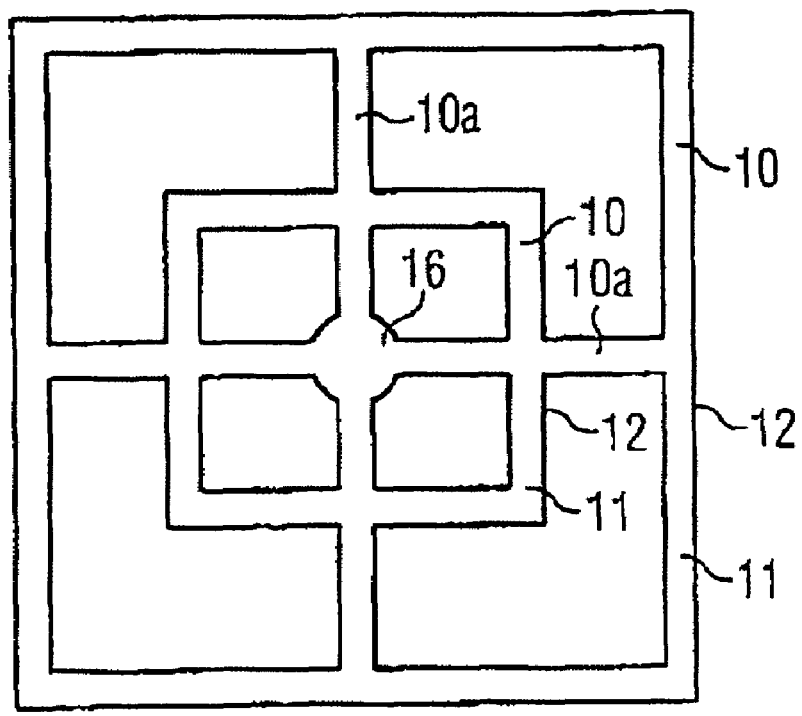
FIG. 4 shows the arrangement of interconnects in a plan view of the top side of the substrate.

FIG. 4 shows a plan view of an arrangement of interconnects 10 such as may be embodied for the contact connection of the top side of the substrate 1, which would be the n-type contact in the example mentioned. The interconnects 10 are arranged in the form of squares 11. The squares 11 have side edges 12, corresponding side edges 12 of the squares 11 being parallel to one another. This results in an arrangement of the squares 11 nested one in the other which may be considered analogously to concentric circles. A soldering area 16 is arranged in the center of the squares 11 and is suitable for being electrically contact-connected with a bonding wire. Furthermore, connecting interconnects 10a arranged in cruciform fashion are provided and provide for the electrical contact connection of the interconnects 10 to the soldering area 16. Consequently, each of the interconnects 10 can be electrically contact-connected by contact connection of the soldering area 16. It is thus also possible for the top side of the substrate 1 to be contact-connected in large-area fashion.

Figure 5:
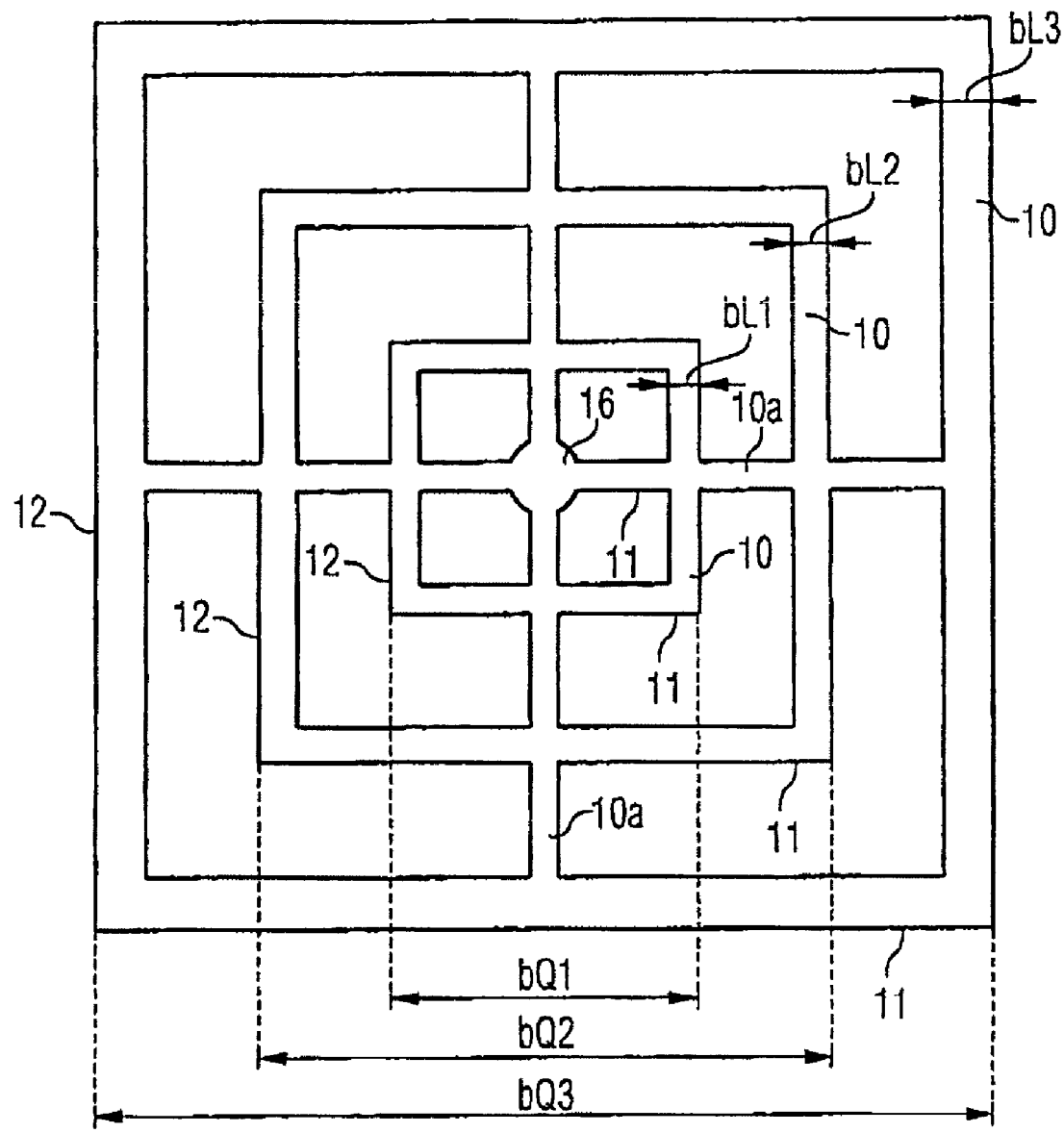
FIG. 5 shows by way of example a further embodiment of interconnects in a plan view of a substrate.

FIG. 5 shows a further embodiment of a contact-connection structure for the top side of the substrate 1. In accordance with FIG. 5, the interconnects 10 are arranged along three squares 11. Each of said squares 11 has a different width, it being possible for the side edges 12 of the squares 11 to be arranged equidistantly with respect to one another. This could be realized for example by virtue of the following dimensioning holding true for the widths bQ1, bQ2, bQ3 of the squares 11:

bQ1=220 μm bQ2=440 μm bQ3=660 μm

The equidistant arrangement of the squares 11 makes it possible to achieve a homogeneous energization of the top side of the substrate 1.

FIG. 5 also shows a further aspect that the width of the interconnects 10 increases as the square area increases. Accordingly, the width of the innermost interconnect bL1 is 16 μm, the width bL2 of the middle interconnect 10 is 20 μm and the width bL3 of the outer interconnect 10 is 27 μm. The dimensions of the widths bL1, bL2, bL3 of the interconnects 10 are chosen in such a way that they increase approximately proportionally to the area that is to be energized by the corresponding interconnect 10.

The thickness dL of the interconnects 10 shown in FIG. 3 is essentially determined by the layer thickness of the soldering area 16 arranged in the center of the squares 11, which has to have a specific minimum thickness in order to ensure reliable soldering. Since it is advantageous to apply the interconnects 10, the connecting interconnects 10a and the soldering area 16 to the top side of the substrate 1 in a single process or mask step, it is likewise advantageous to produce the interconnects 10, the connecting interconnects 10a and also the soldering area 16 in the same layer thickness. In another possible process, it might also be advantageous to make the soldering area 16 thicker than the interconnects 10 or the connecting interconnects 10a, since bonding is not effected on the interconnects 10, 10a and, consequently, the latter can also be made thinner in order to save material, by way of example.

FIG. 6 shows a substrate 1, to the underside of which a radiation-generating layer 2 is applied. Moreover, an electrical contact layer 17 is applied on the underside of the radiation-generating layer 2. The radiation-generating layer 2 has a bevelled side edge 8, which is suitable for reflecting light generated in the radiation-generating layer 2 (along the arrow direction, for example) into the substrate 1 and from there upward in the desired direction and, consequently, for increasing the luminous efficiency of the component further in an advantageous manner. For the reflection at the bevelled side edge 8, it may be advantageous, depending on the difference in refractive index between the radiation-generating layer 2 and the surrounding medium, to utilize a total reflection at said side edge. However, it is also possible, independently of the total reflection, to apply a reflective material 9 to the bevelled side edge 8 and thereby to effect reflection of the radiation in the desired direction. In order to prevent an electrical short circuit between the substrate 1 and the contact area 17, it is also highly expedient, if appropriate, to apply an electrical insulating layer between the reflective material 9, which is advantageously silver or aluminum, and the contact area 17 and/or between the reflective material and the substrate 1 and/or between the reflective material 9 and the radiation generating layer 2. Said insulating layer may be silicon nitride, by way of example. Said insulating layer may be silicon nitride, by way of example.

In the exemplary embodiment shown here, it is advantageous to choose the angle β, which the bevelled side edge 8 forms with the underside of the substrate 1, to be between 30 and 60°.

Figure 7:
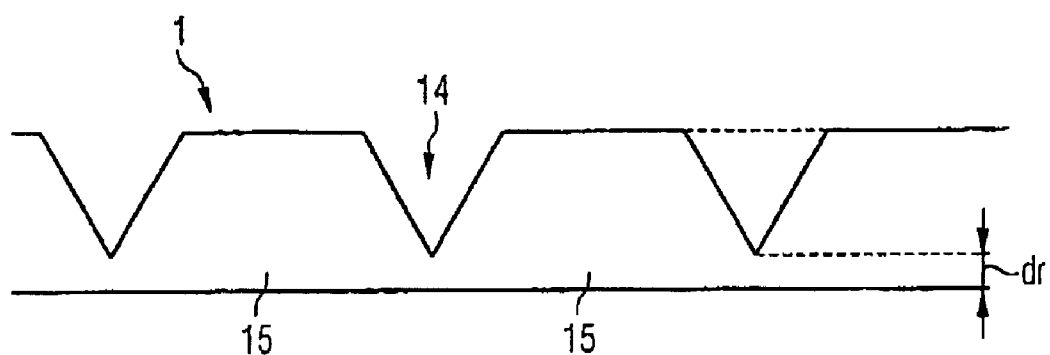
FIG. 7 shows a substrate during the performance of a method for producing the component.

FIG. 7 shows a substrate 1 during the production of a multiplicity of individual substrates 15 which in turn form the basis for a substrate 1 in accordance with FIG. 1. V-shaped trenches 14 are cut into the large substrate 1, a V-shaped saw blade advantageously being used. However, the large substrate 1 is not sawn through entirely, rather a residual thickness dr (which is the same as h in FIG. 1) of the substrate remains. Said residual thickness dr may be 20 μm, by way of example, following the example of FIG. 1. Afterward, the individual substrates 15 may be singulated by breaking or by straight sawing.

The embodiments of the component described in accordance with the figures do not restrict the invention represented here, rather the invention can be embodied with all suitable materials which satisfy the conditions mentioned.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A radiation emitting semiconductor component comprising:
    a radiation-transmissive substrate with inclined side areas and having a refractive index (n1),
    a radiation generating layer arranged on an underside of said substrate and having a refractive index (n2),
    wherein the refractive index (n1) of the substrate is greater than the refractive index (n2) of the radiation generating layer, and the difference between the refractive indices of the substrate and the radiation generating layer results in an unilluminated substrate region into which no photons are coupled directly from the radiation generating layer;
    wherein the substrate has essentially perpendicular side areas in the unilluminated region; and
    wherein the inclined side areas adjoin a top side of the substrate which is remote from the radiation generating layer and parallel to the underside of the substrate.

2. The component as claimed in claim 1, wherein a side of the radiation-generating layer (2) which is remote from the substrate (1) is provided for mounting of the component.

3. The component as claimed in claim 2, wherein a mounting area is formed on the side of the radiation-generating layer which is remote from the substrate.

4. The component as claimed in claim 1, wherein the perpendicular side areas form a base on the underside of the substrate, the inclined side areas adjoining a top side of said base.

5. The component as claimed in claim 4, wherein an upper boundary of the unilluminated region coincides with an upper boundary of the base.

6. The component as claimed in claim 4, wherein the height (h) of the base is between 15 and 30 μm.

7. The component as claimed in claim 1, wherein the inclined side areas form an angle (α) of between 15 and 40° with the underside of the substrate.

8. The component as claimed in claim 1, wherein the substrate has a width (B) of between 300 and 2000 μm on the underside.

9. The component as claimed in claim 1, wherein the substrate has a thickness (D) of between 200 and 300 μm.

10. The component as claimed in claim 1, wherein the radiation-generating layer covers the underside of the substrate apart from an outer free edge having a width (bF) of between 10 and 50 μm.

11. The component as claimed in claim 1, wherein the radiation-generating layer has bevelled side edges, which reflect light emitted laterally with respect to the substrate in the direction of the substrate.

12. The component as claimed in claim 11, wherein the bevelled side edges form an angle (β) of between 20 and 70° with the underside of the substrate.

13. The component as claimed in claim 11, wherein the bevelled edges of the radiation-generating layer form with the substrate an angle (β) suitable for a total reflection of the light at the side edges.

14. The component as claimed in claim 11, wherein the side edges of the radiation-generating layer are covered with an optically reflective material.

15. The component as claimed in claim 14, wherein the optically reflective material is aluminum or silver.

16. The component as claimed in claim 1, wherein contact elements are arranged on the top side of the substrate,
    a transverse conductivity of the substrate leads to a conical extension of a current coupled into the substrate from the contact elements, and
    the contact elements are spaced apart from one another in such a way that current expansion cones touch one another at a depth (T) at which the entire cross-sectional area of the substrate is energized.

17. The component as claimed in claim 16, wherein the contact elements are interconnects running along nested squares, the squares having equidistant side edges parallel to one another.

18. The component as claimed in claim 17, wherein the interconnects have widths (bL1, bL2, bL3) that differ from one another in accordance with a surface of the substrate that is to be energized.

19. The component as claimed in claim 1, wherein the substrate contains silicon carbide.

20. The component as claimed in claim 1, wherein the substrate contains hexagonal 6H silicon carbide.

21. The component as claimed in claim 1, wherein the radiation-generating layer contains gallium nitride.

22. The component as claimed in claim 1, wherein the underside of the substrate has a width (B) of at least 300 μm.

23. A method for producing a radiation-emitting semiconductor component as claimed in claim 1, the method having the following steps:
    a) sawing V-shaped trenches into a radiation-transmissive substrate by means of a suitably shaped saw, a residual thickness (dr) of the substrate remaining throughout,
    b) separating the substrate into a multiplicity of individual substrates along the trenches.

24. The method as claimed in claim 23, wherein the separation is effected by means of a saw having a straight saw blade.

25. The method as claimed in claim 24, wherein the separation is effected by breaking.

26. A radiation emitting semiconductor component comprising:
    a radiation-transmissive substrate with inclined side areas and having a refractive index (n1), and
    a radiation generating layer arranged on an underside of said substrate and having a refractive index (n2),
    wherein the refractive index (n1) of the substrate is greater than the refractive index (n2) of the radiation generating layer, and the difference between the indices of the substrate and the radiation generating layer results in an unilluminated substrate region into which no photons are coupled directly from the radiation generating layer,
    wherein the substrate has essentially perpendicular side areas in the unilluminated region, and
    wherein the radiation-generating layer has bevelled side edges, which reflect light emitted laterally with respect to the substrate in the direction of the substrate.

27. A radiation emitting semiconductor component comprising:
    a radiation-transmissive substrate with inclined side areas and having a refractive index (n1), and
    a radiation generating layer arranged on an underside of said substrate and having a refractive index (n2),
    wherein the refractive index (n1) of the substrate is greater than the refractive index (n2) of the radiation generating layer, and the difference between the indices of the substrate and the radiation generating layer results in an unilluminated substrate region into which no photons are coupled directly from the radiation generating layer,
    wherein the substrate has essentially perpendicular side areas in the unilluminated region, wherein contact elements are arranged on the top side of the substrate, wherein the transverse conductivity of the substrate leads to a conical extension of a current coupled into the substrate from the contact element, wherein the contact elements are spaced apart from one another in such a way that current expansion cones touch one another at a depth (T) at which the entire cross-sectional area of the substrate is energized, wherein the contact elements are interconnects running along nested squares, the squares having equidistant side edges parallel to one another, and wherein the interconnects have widths (bL1, bL2, bL3) that differ from one another in accordance with the surface of the substrate that is to be energized.

* * * * *